United States Patent
Muller et al.

(10) Patent No.: US 10,611,678 B2
(45) Date of Patent: Apr. 7, 2020

(54) HEAT TREATABLE COATED ARTICLE WITH CARBON-DOPED ZIRCONIUM BASED LAYER(S) IN COATING

(71) Applicants: Guardian Europe S.A.R.L., Bertrange (LU); GUARDIAN GLASS, LLC, Auburn Hills, MI (US)

(72) Inventors: Jens-Peter Muller, Differdange (LU); Jean Vieira, Saulnes (FR); Bernd Disteldorf, Mettlach (DE); Allen Chu, Saline, MI (US); Jijun Lao, Canton, MI (US); Yiwei Lu, Ann Arbor, MI (US); Vijayen S. Veerasamy, Ann Arbor, MI (US)

(73) Assignees: GUARDIAN GLASS, LLC, Auburn Hills, MI (US); GUARDIAN EUROPE S.A.R.L., Bertrange (LU)

( * ) Notice: Subject to any disclaimer, the term of this patent is extended or adjusted under 35 U.S.C. 154(b) by 267 days.

(21) Appl. No.: 15/343,348

(22) Filed: Nov. 4, 2016

(65) Prior Publication Data
US 2018/0127307 A1    May 10, 2018

(51) Int. Cl.
| | |
|---|---|
| C23C 14/08 | (2006.01) |
| C03C 17/245 | (2006.01) |
| C03C 17/34 | (2006.01) |
| C03C 17/22 | (2006.01) |
| C23C 14/00 | (2006.01) |
| C23C 14/06 | (2006.01) |

(52) U.S. Cl.
CPC ............ *C03C 17/245* (2013.01); *C03C 17/22* (2013.01); *C03C 17/225* (2013.01); *C03C 17/3435* (2013.01); *C03C 17/3441* (2013.01); *C23C 14/0057* (2013.01); *C23C 14/0605* (2013.01); *C23C 14/0641* (2013.01); *C23C 14/083* (2013.01); *C03C 2217/22* (2013.01); *C03C 2217/24* (2013.01); *C03C 2217/281* (2013.01); *C03C 2217/282* (2013.01); *C03C 2217/78* (2013.01); *C03C 2218/155* (2013.01); *C03C 2218/322* (2013.01)

(58) Field of Classification Search
CPC ..... C03C 17/22; C03C 17/225; C03C 17/245; C03C 17/3435; C03C 17/3441; C03C 2217/22; C03C 2217/24; C03C 2217/281; C03C 2217/282; C03C 2217/78; C03C 2218/155; C03C 2218/322; C23C 14/0057; C23C 14/0605; C23C 14/0641; C23C 14/083
USPC ........................................ 204/192.26–192.28
See application file for complete search history.

(56) References Cited

U.S. PATENT DOCUMENTS

| | | | |
|---|---|---|---|
| 6,303,225 | B1 | 10/2001 | Veerasamy |
| 6,303,226 | B2 | 10/2001 | Veerasamy |
| 7,501,148 | B2 | 3/2009 | Veerasamy |

(Continued)

OTHER PUBLICATIONS

U.S. Appl. No. 15/293,601, filed Oct. 14, 2016; Wang et al.

*Primary Examiner* — Rodney G McDonald

(57) ABSTRACT

In certain example embodiments, a coated article includes a carbon-doped zirconium based layer before heat treatment (HT). The coated article is heat treated sufficiently to cause the carbon-doped zirconium oxide and/or nitride based layer to result in a carbon-doped zirconium oxide based layer that is scratch resistant and/or chemically durable. The doping of the layer with carbon (C) has been found to improve wear resistance.

30 Claims, 4 Drawing Sheets

(56) References Cited

U.S. PATENT DOCUMENTS

| | | | |
|---|---|---|---|
| 7,537,801 B2 | 5/2009 | Veerasamy et al. | |
| 7,767,306 B2 | 8/2010 | Veerasamy | |
| 8,029,864 B2 | 10/2011 | Veerasamy | |
| 8,153,266 B2 | 4/2012 | Petrmichl et al. | |
| 8,221,832 B2 | 7/2012 | Murphy et al. | |
| 8,277,946 B2 | 10/2012 | Veerasamy | |
| 8,518,475 B2 | 8/2013 | Veerasamy | |
| 8,580,336 B2 | 11/2013 | Murphy et al. | |
| 9,038,419 B2 | 5/2015 | Muller et al. | |
| 2001/0003628 A1* | 6/2001 | Demiryont | C03C 17/36 428/630 |
| 2005/0191494 A1 | 9/2005 | Veerasamy | |
| 2014/0150497 A1 | 6/2014 | Muller et al. | |
| 2014/0220359 A1 | 8/2014 | Wang et al. | |
| 2014/0220360 A1 | 8/2014 | Wang et al. | |

\* cited by examiner

HEAT TREATABLE COATED ARTICLE WITH CARBON-DOPED ZIRCONIUM BASED LAYER(S) IN COATING

This invention relates to a method of making a coated article to be used in a window unit or any other suitable application such as furniture glass, display case glass, shower glass, picture frame glass, or the like. For example, certain embodiments of this invention relate to a method of making a coated article including a step of heat treating a glass substrate coated with at least a layer comprising zirconium (Zr) oxide and/or nitride doped with carbon (C). Doping with carbon (and similar phrases such as "carbon-doped" and "doped with carbon") includes both doping with carbon and doping with carbon plus other material(s). Following heat treatment, the coated article includes a glass substrate supporting at least a layer of or including zirconium oxide doped with carbon.

Optionally, a layer of or including diamond-like carbon (DLC) may be provided over the carbon-doped zirconium based layer prior to heat treatment (HT). DLC may be used to generate energy during HT, e.g., due to its combustion during HT, for transforming at least another layer in the coating so as to form a new post-HT layer(s) (e.g., carbon-doped zirconium oxide based layer) which may not have been present in that form before the HT. Optionally, a dielectric barrier layer of or including silicon nitride, silicon oxynitride, silicon oxide, or the like may be provided under the Zr-based layer(s) so as to be located between at least the glass substrate and the Zr-based layer(s).

Certain other example embodiments of this invention relate to such a coated article, heat treated or not, which may be used in window applications, or any other suitable application such as furniture glass, shower glass, window glass, display case glass, or the like.

BACKGROUND OF THE INVENTION

Diamond-like carbon (DLC) is sometimes known for its mechanical durability such as scratch resistant properties. For example, different types of DLC are discussed in the following U.S. Pat. Nos. 6,303,226, 6,303,225, which are hereby incorporated herein by reference. It would sometimes be desirable to provide a window unit or other glass article with a protective coating including DLC in order to protect it from scratches and the like. Unfortunately, DLC tends to oxidize and burn off at temperatures of from approximately 350 degrees C. (possibly from 380 to 400 degrees C.) or higher, as the heat treatment is typically conducted in an atmosphere including oxygen. Thus, it will be appreciated that DLC alone as a protective overcoat cannot withstand heat treatments (HT) at the extremely high temperatures described above which are often required in the manufacture of vehicle windows, IG window units, glass table tops, tempered glass articles, and/or the like. Accordingly, DLC cannot be used alone as a coating to be heat treated, because it will oxidize during the heat treatment and substantially disappear as a result of the same (i.e., it will burn off).

Certain other types of scratch resistant materials also are not capable of withstanding heat treatment sufficient for tempering, heat strengthening and/or bending of an underlying glass substrate.

Windows are known in the art. For example, conventional IG window units include at least first and second glass substrates (one of which may have a solar control coating on an interior surface thereof) that are coupled to one another via at least one seal(s) or spacer(s). The resulting space or gap between the glass substrates may or may not be filled with gas and/or evacuated to a low pressure in different instances. However, many IG units are required to be tempered. Thermal tempering of the glass substrates for such IG units typically requires heating the glass substrates to temperature(s) of at least about 580 or 600 degrees C. for a sufficient period of time to enable thermal tempering.

Other types of coated articles also require heat treatment (HT) (e.g., thermal tempering, heat bending, and/or heat strengthening) in certain applications. For example and without limitation, glass shower doors, glass table tops, and the like require HT in certain instances.

Accordingly, those skilled in the art will appreciate that a need in the art exists for a method of making a scratch resistant coated article that is capable of being heat treated (HT) so that after heat treatment the coated article is still scratch resistant. A need for corresponding coated articles, both heat treated and pre-HT, also exists.

BRIEF SUMMARY OF EXAMPLES OF INVENTION

In certain example embodiments of this invention, there is provided a method of making a coated article (e.g., furniture glass, shower door window, window such as for a vehicle or building, etc.) that is capable of being heat treated so that after being heat treated (HT) the coated article is scratch resistant to an extent more than uncoated glass.

In certain example embodiments of this invention, prior to heat treatment a coated article includes at least a layer(s) of or including carbon-doped zirconium oxide and/or nitride on a glass substrate. In certain example embodiments, prior to HT, the only metal in the carbon-doped zirconium oxide and/or carbon doped zirconium nitride inclusive layer is Zr (the layer is metal free or substantially metal free, except for the Zr). In certain example embodiments of this invention, prior to and/or after HT, the carbon-doped zirconium oxide and/or carbon doped zirconium nitride inclusive layer is free of, or substantially free of, Cu (copper) and W (tungsten). Doping of the Zr oxide and/or nitride based layer may be performed during layer deposition using a carbon inclusive gas such as $C_2F_6$ or the like. This carbon-doped zirconium oxide and/or carbon doped zirconium nitride inclusive layer may be the only layer on the glass substrate in certain example embodiments, or alternatively other layer(s) may be present. For instance, one or more layers of or including diamond-like carbon (DLC) may be present on the glass substrate over at least the carbon-doped zirconium based layer. As another example, a dielectric barrier layer may be present between the glass substrate and the carbon-doped zirconium based layer. Heat treatment (e.g., thermal tempering) of the coated article causes the carbon-doped zirconium based layer to transform into a layer of or including carbon-doped zirconium oxide that can be used for scratch resistant and/or corrosion resistant purposes.

Surprisingly, it has been found that the addition of carbon (C) to the zirconium based layer during deposition via carbon containing gas improves the wear resistance of the layer following heat treatment, compared to if the carbon is not present and compared to a layer of DLC. Unexpectedly, it has been found that the addition of the carbon to the zirconium based layer remarkably improves the wear resistance of the layer, after heat treatment, compared to a pure zirconium oxide coating on a glass substrate, and also compared to a pure DLC coating on a glass substrate. Furthermore, it has been unexpectedly found that the addition of the carbon to the zirconium based layer increases visible transmission and provides for improved color (e.g., reduced b* color value) compared to if only a DLC layer was provided on a glass substrate over a silicon nitride layer. Thus, a coated article with at least improved scratch resistance (SR) is provided compared to DLC coated glass.

In certain example embodiments, an optional layer of or including diamond-like carbon (DLC) may be provided on the glass substrate over at least the C-doped zirconium inclusive layer prior to heat treatment, for purposes of protecting the C-doped zirconium inclusive layer prior to heat treatment (HT) such as during transport or processing. In certain example embodiments, the DLC may be hydrogenated. The HT causes the layer comprising C-doped zirconium oxide and/or nitride to be transformed into a new post-HT layer comprising C-doped zirconium oxide, and optionally causes any optional DLC layer to burn off or combust. During HT, the optional DLC layer(s) will be oxidized and burn off. While the carbon content in the carbon-doped zirconium oxide based layer following heat treatment comes primarily from the carbon doping of the zirconium based layer during deposition of the layer prior to HT, a small amount of the carbon in the post-HT layer may come from the DLC layer that combusts during HT. The new post-HT layer comprising C-doped zirconium oxide may also include some nitrogen in certain example embodiments of this invention.

In certain example embodiments, at least prior to heat treatment, the layer(s) comprising or consisting essentially of C-doped zirconium oxide and/or nitride may also be doped with fluorine (F) in certain instances.

The new post-HT layer comprising C-doped zirconium oxide is very scratch resistant. Thus, it can be seen that a technique has been provided which allows for a heat treatable scratch resistant product which is also corrosion resistant; and the coated article may also have good transmission properties.

In certain example embodiments of this invention, there is provided a method of making a heat treated coated article, the method comprising: having a coated article including a coating supported by a glass substrate, the coating comprising a carbon-doped layer comprising an oxide and/or nitride of zirconium; and thermally tempering the coated article, including the glass substrate and the carbon-doped layer comprising an oxide and/or nitride of zirconium, so that after the tempering a layer comprising carbon-doped zirconium oxide is provided on the glass substrate, wherein the layer comprising carbon-doped zirconium oxide comprises from 4.7 to 20 atomic % carbon and is substantially free of tungsten, copper, and zinc. The method may further include sputter-depositing the carbon-doped layer comprising an oxide and/or nitride of zirconium in the presence of at least carbon inclusive gas such as $C_2F_6$.

In certain embodiments of this invention, there is provided a method of making a heat treated coated article, the method comprising: having a coated article including a coating supported by a glass substrate, the coating comprising a carbon-doped layer comprising an oxide and/or nitride of zirconium, and wherein the carbon-doped layer comprising an oxide and/or nitride of zirconium is substantially free of tungsten, copper, and zinc; and thermally tempering the coated article, including the glass substrate and the carbon-doped layer comprising an oxide and/or nitride of zirconium, so that after the tempering a layer comprising carbon-doped zirconium oxide is provided on the glass substrate, wherein the layer comprising carbon-doped zirconium oxide comprises from 4.7 to 20 atomic % carbon.

DETAILED DESCRIPTION OF EXAMPLE EMBODIMENTS OF THE INVENTION

Figure 1:
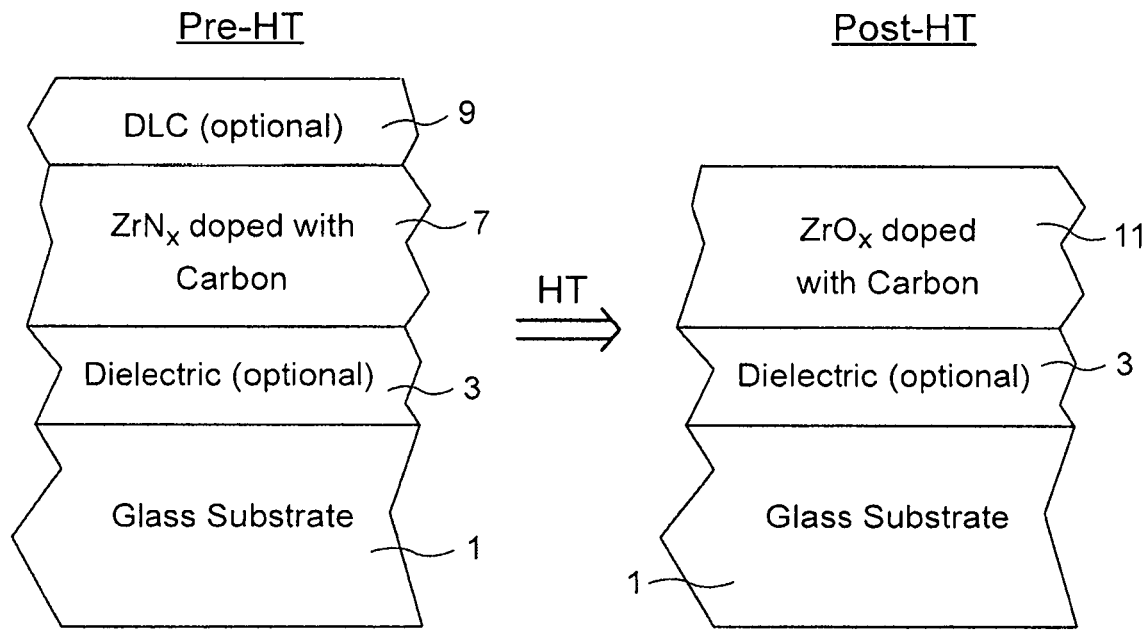
FIG. 1 is a schematic diagram illustrating cross-sections of coated articles according to an embodiment of this invention before and after heat treatment.

Referring now more particularly to the accompanying drawings in which like reference numerals indicate like parts or layers throughout the several views.

Referring to FIGS. 1-4, in certain example embodiments of this invention, prior to heat treatment a coated article includes at least one layer(s) 7, 7' 7", 52 of or including carbon-doped zirconium oxide and/or nitride on a glass substrate 1. Carbon (C) doping of the zirconium oxide, zirconium oxynitride, or zirconium nitride layer (7, 7', 7', or 52) may be in the form of doping with carbon inclusive gas (e.g., $C_2F_6$ and/or $C_2H_2$) during the layer's sputter-deposition process, or the like in example embodiments of this invention. Doping with carbon (and similar phrases such as "carbon-doped", "C-doped" and "doped with carbon") includes both doping with carbon and doping with carbon plus other material such as F. However, in certain example embodiments, prior to HT, the only metal in the carbon-doped zirconium oxide and/or carbon doped zirconium nitride inclusive layer is Zr (the layer is metal free or substantially free of metal, except for the Zr). Thus, in certain example embodiments of this invention, prior to and/or after HT, the carbon-doped zirconium oxide and/or carbon doped zirconium nitride inclusive layer is free of, or substantially free of, Cu (copper) and W (tungsten).

The carbon-doped layer 7, 7', 7", 52, 11 may be the only layer on the glass substrate 1 in certain example embodiments, or alternatively other layers may be present. For instance, one or more layers 9 of or including diamond-like carbon (DLC) may be present on the glass substrate over at least the carbon-doped zirconium based layer prior to heat treatment in certain instances. As another example, a dielectric barrier layer(s) 3 may be present between the glass substrate 1 and the carbon-doped zirconium based layer 7, 7', 7", 52, 11 before and/or after heat treatment. In addition to layer 7, 7', 7", one or both of layers 3, 9 may be present. Still referring to FIGS. 1-4, heat treatment (e.g., thermal tempering) of the coated article causes the carbon-doped zirconium based layer 7, 7', 7", 52 (and layer 53) to transform into a layer of or including carbon-doped zirconium oxide 11 that can be used for scratch resistant and/or corrosion resistant purposes. In certain example embodiments, the top layer 11 of the coating following heat treatment consists essentially of carbon-doped zirconium oxide (e.g., $C:ZrO_x$) which is both scratch resistant (SR) and corrosion resistant. Layer 11 may also include small amounts of other materials such as one or more of nitrogen, F, or the like. Other layer(s), in addition to the C-doped zirconium based layer post-HT, may or may not be provided in different example embodiments of this invention.

Surprisingly, it has been found that the addition of the carbon (C) to the zirconium based layer remarkably improves the wear resistance of the layer, compared to if the additional carbon doping is not present via $C_2F_6$. Wear resistance may be improved by, for example at least a factor of 10 compared to DLC. Unexpectedly, it has been found that the addition of the carbon to the zirconium based layer remarkably improves the wear/scratch resistance of the layer, before and/or after heat treatment, compared to a pure zirconium oxide coating on a glass substrate, and also compared to a pure non-heated treated DLC coating on a glass substrate. Thus, a coated article with improved scratch resistance (SR) and improved durability is provided. Accordingly, a transparent lubricious coating is provided for glass and ceramic substrates, comprising Zr, C and oxygen with scratch resistance better than that of pure zirconium oxide. It is believed that improved wear resistance is able to be obtained because significantly more carbon, especially more Zr-C bonds, are utilized in various embodiments of this invention, with the absence or substantial absence of meals such as tungsten and copper. In certain example embodiments, conventional use of a TPF overcoat and/or a sacrificial protective layer (SPL) may be avoided.

High performance of the composite coating may be contributed by zirconium oxide (e.g., $ZrO_2$) alloyed with C. Carbon (C) and zirconium (Zr) may be cosputtered onto the substrate, directly or indirectly, with or without a thin barrier layer 9 therebetween via a magnetron sputtering process in certain example embodiments. Inert gas such as argon, as well as reactive gas such as oxygen and/or nitrogen, may be used during the sputtering. And, as mentioned herein, carbon inclusive gas is also preferably used during the sputtering in order to dope the layer with carbon. Thus, for example, Zr sputtering targets may be used in conjunction with carbon inclusive gas (as well as other gas such as Ar, N and/or O) in order to sputter-deposit the carbon doped Zr based layer 7, 7', 7", 52. In certain example embodiments, with respect to carbon content of the layer, the C content throughout the majority of the thickness of layer 7, 7', 7", 52 and/or 11 may be from about 4.7-20%, more preferably from about 4.8-15%, more preferably from about 5-10%, even more preferably from about 5-9%, and most preferably from about 5.2-7% (atomic %). Note that the percentages (%) herein are atomic percentages (atomic %). After heat treating (e.g., thermal tempering), the coating is oxidized to form layer 11 which is of or including zirconium oxide doped with carbon. In certain example embodiments of this invention, at least about 5 sccm (e.g,. 5-35 sccm), more preferably at least about 10 sccm, and most preferably at least about 12 sccm (e.g,. from about 10-35 sccm) of $C_2F_6$ gas may be used during the sputter-deposition of the C-doped layer (7, 7', 7", 52) in order to provide much of the C doping, while other gases such as nitrogen, argon, and possibly a small amount of oxygen may also be present during the sputter-deposition of such layers.

In certain example embodiments of this invention, the C-doped zirconium based layer 7, 7', 7", 52 may be of or include one or more of: C-doped $ZrO_x$ (e.g., $ZrO_2$), C-doped $ZrN_x$, C-doped $ZrO_xN_y$, or mixtures thereof, prior to heat treatment. The C may or may not be oxided and/or nitrided in the layer 7, 7', 7", 52 before HT. In certain embodiments, the heat treatment (HT) may involve heating a supporting glass substrate 1, with at least the C-doped zirconium based layer(s) 7, 7', 7", 52 thereon, using temperature(s) of from 550 to 800 degrees C., more preferably from 580 to 800 degrees C. (which is well above the burn-off temperature of the optional DLC overcoat). The high temperature developed during the HT heats the C-doped zirconium based layer(s) 7, 7', 7", 52 and causes the layer to transform into the C-doped zirconium oxide based layer 11 as a result of the HT. The carbon may or may not be oxided and/or nitrided in the C-doped layer 11 after HT. It is also noted that fluorine may also optionally be present in the final post-HT layer 11 in certain example embodiments. In certain example embodiments, the layers 7, 7', 7", 52 and 11 may be free of, or substantially free of (no more than 1% of, or no more than 0.5% of) other metals such as tungsten (W), copper (Cu) and zinc (Zn).

In certain example embodiments of this invention, the post-HT layer(s) 11 comprising or consisting essentially of C-doped zirconium oxide includes a nanocrystalline cubic lattice structure and/or a crystalline or nanocrystalline tetragonal lattice structure. It is noted that "consisting essentially of" means that the layer contains no material amount of any material other than the recited elements. For example, a layer 11 "consisting essentially of" C-doped zirconium oxide contains no material amount of any element other than carbon, zirconium, and oxygen. As another example, a layer 7, 7', 7", 52 and/or 11 having a metal portion "consisting essentially of" Zr contains no material amount of any metal other than zirconium (although various amounts of non-metals such as oxygen, nitrogen and/or carbon may be present). In certain example embodiments of this invention, the metal content of layer 7, 7', 7", 52 and/or 11 is made up of from 80-100% Zr, more preferably from 90-100% Zr, and most preferably from 99-100% Zr.

The entire layer(s) 11 may be of a nanocrystalline cubic lattice structure type and/or tetragonal lattice structure type, or alternatively only part of the layer(s) 11 may include nanocrystalline cubic lattice structure and/or tetragonal lattice structure post-HT. Prior to HT, the C-doped zirconium inclusive layer 7, 7', 7", 52 need not have a nanocrystalline cubic and/or tetragonal lattice structure. Thus, it will be appreciated that the HT may cause the C-doped zirconium based layer 7, 7', 7", 52 to transform into a C-doped zirconium oxide based layer 11 having a nanocrystalline cubic lattice structure and/or crystalline tetragonal lattice structure. In certain example embodiments, as a result of the HT, the amount of oxygen in the post-HT zirconium inclusive layer(s) 11 is higher than the amount of oxygen in the pre-HT zirconium inclusive layer(s) 7, 7', 7", 52. Instead of a nanocrystalline cubic lattic structure, it is optional that post-HT layer(s) 11 comprising C-doped zirconium oxide may include a nanocrystalline tetragonal structure (e.g., cubic may be replaced with tetragonal in any embodiment herein).

In certain example embodiments of this invention, there is more Zr than C in the C-doped zirconium oxide based layers 7, 7', 7" and 11. Thus, each such layer 7, 7', 7", 52, 11 is said to be C-doped.

In certain example embodiments of this invention, the C-doped zirconium based layers 7, 7' 7", 52 and 11 may be from about 1 to 250 nm thick, more preferably from about 1 to 100 nm thick, and most preferably from about 5 to 50 nm thick in certain example embodiments of this invention, when high transmission is desired. An example thickness is about 300 angstroms (30 nm). In certain example embodiments of this invention, before and/or after HT, coated articles herein have a visible transmission of at least about 50%, more preferably at least about 60%, and possibly at least about 70% or 75%.

In certain example embodiments, at least prior to heat treatment, one or more of the C-doped zirconium based layers 7, 7', 7", 52, 11 may also be doped with fluorine (F). This may be done, for example, by using a gas such as $C_2F_6$ for the carbon doping during sputter-deposition of the C-doped zirconium based layer. Of course, following heat treatment the C-doped zirconium oxide based layer 11 may also be doped with F and/or C in a corresponding or substantially corresponding manner since it was present before HT. This doping with C and/or F may be used in conjunction with any embodiment discussed herein.

The C-doped zirconium based layer 7, 7', 7", 52 may be deposited on the glass substrate (including optionally over a dielectric or other type of barrier layer(s) 3) by any suitable technique including but not limited to PVD and CVD. Sputter deposition is appropriate in certain example instances. The coating may be used in in-deposited form (i.e., no tempering or the like), but it may often be heat treated at the high temperatures discussed herein (e.g., for tempering, heat bending and/or heat strengthening) to densify the C-doped zirconium based layer and reduce its absorption. The coating may be heat treated in a standard furnace used to temper glass in certain example instances. Optionally, a sacrificial layer 9 comprising carbon or DLC may be provided on the glass substrate over at least the C-doped zirconium based layer 7, 7', 7", 52 for mechanical protection prior to HT (this carbon inclusive layer 9 typically burns off during HT, and may result in additional carbon being input into the post-HT layer 11). While the burning off of the DLC inclusive layer 9 can introduce some small amount of carbon into the layer 11 post-HT, the majority of the carbon doping of the final layer 11 results from the carbon doping of the original pre-HT layer 7, 7', 7", 52 by for example sputter depositing the layer in a carbon gas inclusive atmosphere.

FIG. 1 is a schematic diagram illustrating how a coated article can be made according to an example embodiment of this invention. Initially, a coated article is formed and includes a glass substrate 1. The coated article includes, supported by glass substrate 1, at least one optional dielectric barrier layer 3 of or including silicon nitride, silicon oxynitride, silicon oxide, or the like; at least one layer of or including C-doped zirconium nitride 7 (e.g., C:ZrN and/or any suitable stoichiometry), and an optional top layer of or including DLC 9.

Glass substrate 1 is typically of or includes soda-lime-silica glass, although other types of glass may be used in certain instances. Dielectric layer(s) 3 is provided in order to prevent or reduce sodium diffusion into the C-doped zirconium based layer 7 during HT (i.e., a diffusion barrier). Any of the aforesaid barrier layer 3 materials may be doped (e.g., 0.5 to 15%) with Al, stainless steel, or any other metal(s) in certain embodiments of this invention. Barrier layer(s) 3 is formed on the glass substrate 1 via sputtering, or via any other suitable technique. Dielectric barrier layer 3 may be from about 50 to 900 Å thick in certain example embodiments of this invention, more preferably from about 80-700 Å thick, and most preferably from about 100 to 400 Å thick (e.g., about 150 angstroms thick).

The layer 9 comprising DLC formed on the glass substrate 1 may be of any suitable type of DLC, including but not limited to any of the DLC types described in any of U.S. Pat. Nos. 6,592,993; 6,592,992; 6,531,182; 6,461,731; 6,447,891; 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; and/or 5,470,661, all of which are hereby incorporated herein by reference. For purposes of example only, DLC inclusive layer(s) 9 may be from about 5 to 1,000 angstroms (Å) thick in certain example embodiments of this invention, more preferably from 10-300 Å thick, and most preferably from 25 to 50 Å thick. In certain example embodiments of this invention, DLC layer(s) 9 may have an average hardness of at least about 10 GPa, more preferably at least about 20 GPa, and most preferably from about 20-90 GPa. Such hardness renders layer 9 resistant to scratching, certain solvents, and/or the like, before the sacrificial layer 9 burns off during HT. Layer 9 may, in certain example embodiments, be of or include a special type of DLC known as highly tetrahedral amorphous carbon (t-aC), and may be hydrogenated (t-aC:H) in certain embodiments. In certain hydrogenated embodiments, the t-aC:H type of DLC 9 may include from 4 to 39% hydrogen, more preferably from 5-30% H, and most preferably from 10-20% H. This t-aC or t-aC:H type of DLC for layer(s) 9 may include more $sp^3$ carbon–carbon (C—C) bonds than $sp^2$ carbon–carbon (C—C) bonds. In certain example embodiments, at least about 50% of the carbon–carbon bonds in DLC layer 9 may be $sp^3$ type carbon–carbon (C—C) bonds, more preferably at least about 60% of the carbon–carbon bonds in the layer(s) may be $sp^3$ carbon–carbon (C—C) bonds, and most preferably at least about 70% of the carbon–carbon bonds in the layer(s) may be $sp^3$ carbon–carbon (C—C) bonds. In certain example embodiments of this invention, the DLC in layer 9 may have an average density of at least about 2.4 gm/cm$^3$, more preferably at least about 2.7 gm/cm$^3$. Example linear ion beam sources that may be used to deposit DLC inclusive layer 9 on substrate 1 over the layers 3 and 7 include any of those in any of U.S. Pat. Nos. 6,261,693, 6,002,208, 6,335,086, or 6,303,225 (all incorporated herein by reference). When using an ion beam source to deposit layer 9, hydrocarbon feedstock gas(es) (e.g., $C_2H_2$), HMDSO, or any other suitable gas, may be used in the ion beam source in order to cause the source to emit an ion beam toward substrate 1 for forming layer 9. It is noted that the hardness and/or density of layer 9 may be adjusted by varying the ion energy of the depositing apparatus. In certain example embodiments, at least about 2,000 V (anode to cathode volts), e.g., about 3,000 V, may be used in the ion source in depositing layer 9. It is noted that the phrase "on the substrate" as used herein is not limited to being in direct contact with the substrate as other layer(s) may still be provided therebetween.

C-doped zirconium nitride inclusive layer 7 is provided on the glass substrate 1, and optionally between DLC layer 9 and dielectric barrier layer 3 in the FIG. 1 embodiment. In certain example embodiments, C-doped zirconium nitride inclusive layer 7 may be located directly between DLC layer 9 and barrier layer 3 so as to contact each of them; however in other example embodiments other layer(s) (not shown)

may be provided therebetween. The C-doped zirconium nitride inclusive layer 7 may consist essentially of carbon, zirconium and nitride, or alternatively may include other materials including but not limited to oxygen and/or dopants such as Al or F. C-doped zirconium nitride inclusive layer 7 may be formed by sputtering or the like in certain example embodiments of this invention. In certain example embodiments of this invention, the C-doped zirconium nitride of layer 7 may possibly be represented by C doped $Zr_xN_y$, where the ratio x:y is from about 0.5 to 1.3, more preferably from about 0.8 to 1.2, and may be about 1.0 in certain example embodiments (the C may also be oxided and/or nitrided in the layer 7).

Once the pre-HT coated article shown on the left side of FIG. 1 is formed, it may or may not be subjected to heat treatment sufficient for at least one of heat bending, thermal tempering, and/or heat strengthening. Referring to FIG. 1, when subjected to HT (e.g., in a furnace using temperature(s) of from 550 to 800 degrees C., more preferably from 580 to 800 degrees C.), the upper or outer DLC inclusive layer 9 burns off due to combustion because of the high temperatures used during HT. The high temperature heats the layer 7 comprising C-doped zirconium nitride to a temperature(s) sufficient to cause the layer to densify and increase its visible transmission by decreasing its absorption. Because the layer comprising C-doped zirconium nitride 7 is heated to such a high temperature during HT in an environment containing oxygen, the layer 7 is transformed during the HT into a new post-HT layer comprising or consisting essentially of C-doped zirconium oxide 11. The new post-HT layer comprising C-doped zirconium oxide 11 may also include nitrogen and/or fluorine in certain example embodiments of this invention. The new post-HT layer comprising C-doped zirconium oxide 11 is scratch resistant thereby providing a heat treated scratch resistant coated article. It is noted that the phrase "zirconium oxide" as used herein includes $ZrO_2$ and/or any other stoichiometry where Zr is at least partially oxided. The post-HT layer comprising C-doped zirconium oxide 11 may include from 0-30% nitrogen in certain example embodiments of this invention, more preferably from 0-20% nitrogen, even more preferably from 0-10% nitrogen, and possibly from about 1-5% nitrogen in certain example embodiments of this invention (atomic %). In certain example embodiments of this invention, the post-HT layer comprising C-doped zirconium oxide 11 includes a nanocrystalline cubic lattice or tetragonal structure (although the pre-HT layer comprising C-doped zirconium nitride need not in certain instances). In certain example embodiments of this invention, the heat treated layer 11 comprising C-doped zirconium oxide includes $C:Zr_xO_y$, wherein y/x is from about 1.2 to 2.5, more preferably from about 1.4 to 2.1. As explained above, it has been found that the addition of the carbon (C) to the zirconium based layer 7, 7', 7", 52, 11 remarkably improves the scratch resistance of the layer following heat treatment, compared to if the carbon is not present.

The final HT (or even the non-HT) coated article of FIG. 1 is scratch resistant and may be used in various applications, including but not limited to IG window units, furniture glass, shower door windows, laminated vehicle windshields, other types of vehicle windows, display glass, and/or the like.

Figure 2:
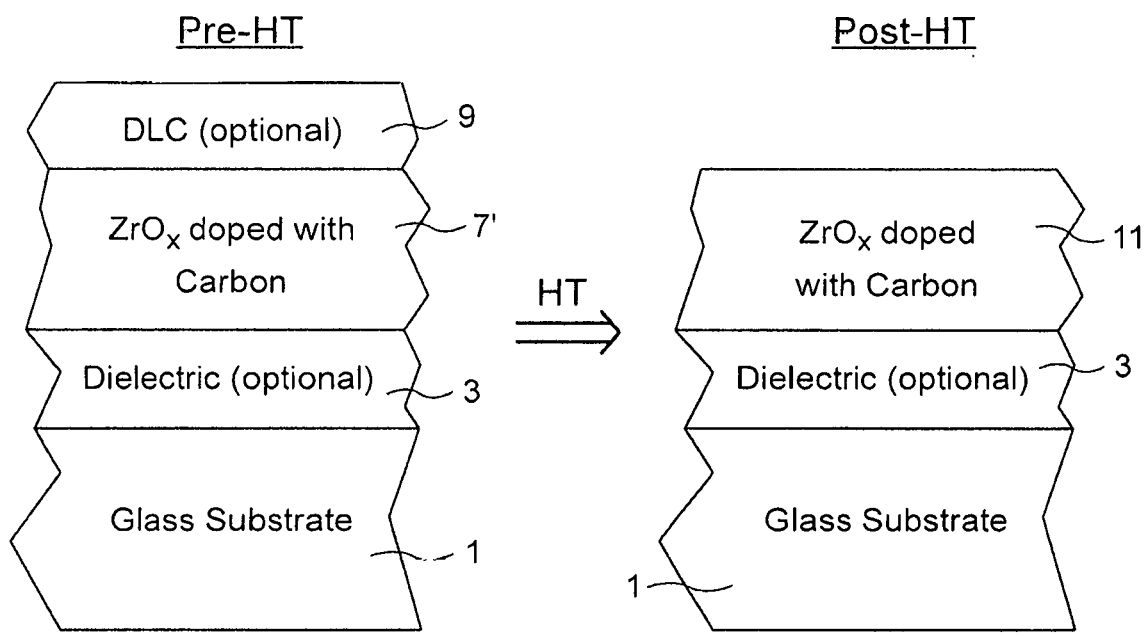
FIG. 2 is a schematic diagram illustrating cross-sections of coated articles according to an embodiment of this invention before and after heat treatment.

FIG. 2 illustrates another example embodiment according to this invention. The FIG. 2 embodiment is the same as the FIG. 1 embodiment described above, except that pre-HT C-doped zirconium nitride layer 7 of the FIG. 1 embodiment has been replaced with a C-doped zirconium oxide layer 7' in the FIG. 2 embodiment. The thicknesses, Zr contents, C contents, ratios, etc. discussed above with respect to layer 7 apply to layer 7' in the FIG. 2 embodiment as well as the layer 7 in the FIG. 1 embodiment. In other words, the FIG. 2 embodiment is the same as the FIG. 1 embodiment except that the nitrogen in layer 7 has been replaced (or supplemented) with oxygen. Regarding the layer 7' of or including C-doped $ZrO_x$ in FIG. 2, "x" may be from about 1 to 2 in certain example embodiments of this invention, more preferably from about 1 to 1.9. The zirconium oxide based layer 7' in the FIG. 2 embodiment, which is C-doped as discussed herein, may or may not also include nitrogen. The post-HT layer 11 in the FIG. 2 embodiment is essentially the same as that described above with respect to the FIG. 1 embodiment. This is because the HT causes both C-doped $ZrO_x$ (see 7' in FIG. 2) and C-doped $ZrN_x$ (see 7 in FIG. 1) to transform into a more dense and less absorbing C-doped $ZrO_x$ top layer 11 as shown in FIGS. 1-2.

Figure 3:
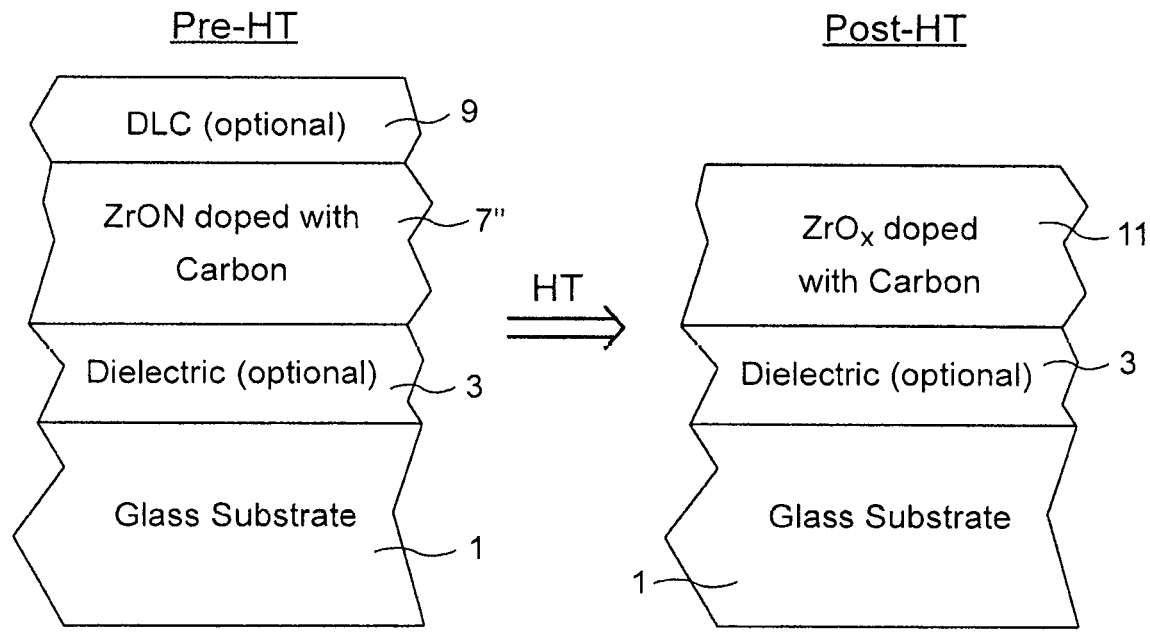
FIG. 3 is a schematic diagram illustrating cross-sections of coated articles according to an embodiment of this invention before and after heat treatment.

FIG. 3 illustrates another example embodiment according to this invention. The FIG. 3 embodiment is the same as the FIG. 1 embodiment described above, except that pre-HT C-doped zirconium nitride layer 7 of the FIG. 1 embodiment has been replaced with a C-doped zirconium oxynitride layer 7" in the FIG. 3 embodiment. The thicknesses, Zr contents, C contents, ratios, etc. discussed above also apply to layer 7" in the FIG. 3 embodiment. In other words, the FIG. 3 embodiment is the same as the FIG. 1-2 embodiments except that the layer 7" is of or includes C-doped zirconium oxynitride, where the carbon may or may not be oxided and/or nitrided. The post-HT layer 11 in the FIG. 3 embodiment is essentially the same as that described above with respect to the FIG. 1-2 embodiments. This is because the HT causes both C-doped $ZrO_x$ (see 7' in FIG. 2), C-doped $ZrN_x$ (see 7 in FIG. 1) and C-doped Zr oxynitride (see 7" in FIG. 3) to transform into a more dense and less absorbing layer 11 of or including Cu-doped $ZrO_x$ as shown in FIGS. 1-3. Of course, layer 11 may contain small amounts of other materials such as nitrogen and/or fluorine.

Figure 4:
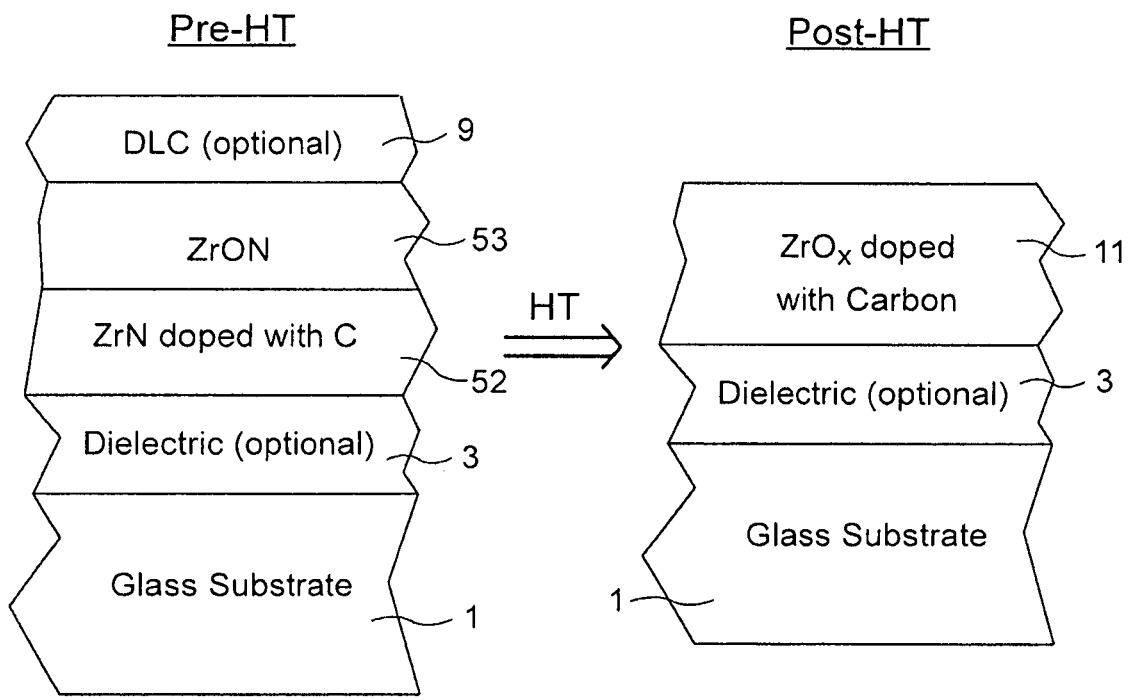
FIG. 4 is a schematic diagram illustrating cross-sections of coated articles according to an embodiment of this invention before and after heat treatment.

FIG. 4 illustrates another example embodiment according to this invention. The FIG. 4 embodiment is the same as the FIG. 1 embodiment described above, except that pre-HT C-doped zirconium nitride inclusive layer 7 of the FIG. 1 embodiment has been labeled as 52 and that a layer 53 of or including zirconium oxynitride has been provided between the C-doped ZrN layer 52 and the DLC based layer 9. Layer 53 of or including zirconium oxynitride may or may not be doped with C in different embodiments. The thicknesses, Zr contents, C contents, ratios, etc. discussed above regarding layers 7, 7' and 7" also apply to layer 52. The post-HT layer 11 in the FIG. 4 embodiment is essentially the same as that described above with respect to the FIG. 1-3 embodiments. This is because the HT causes both C-doped ZrN layer 52 and zirconium oxynitride inclusive layer 53 to transform into a more dense and less absorbing layer 11 of or including C-doped $ZrO_x$ as shown in FIGS. 1-4. Of course, layer 11 may contain small amounts of other materials such as nitrogen and/or fluorine.

In certain example embodiments of this invention, one or more of layers 7, 7', 7", 52 and/or 11 may be doped with from about 0.01 to 10.0% F, more preferably from about 0.1 to 8.0% F, even more preferably from about 0.3 to 5.0% F, still more preferably from about 0.4 to 2% F, and most preferably from about 0.5 to 1.0% F (in terms of atomic percent).

In certain example embodiments, the layers 7, 7', 7", 52 and 11 may be free of, or substantially free of, metals other than Zr (such as Zn, Cu, Sn and W).

Any suitable type of glass substrate 1 may be used in different embodiments of this invention. For example, various types of soda lime silica glass or borosilicate glass may be used for substrate 1. Optionally, the substrate 1 could alternatively be of another ceramic such as quartz.

In certain example embodiments of this invention, the layers 3 and 7, 7', 7", 52, 53 are sputter-deposited on substrate 1. And layer 9 may be ion-beam deposited on the substrate 1, over the previously deposited layers.

In certain example embodiments, a coating includes or consists of a carbon-doped zirconium oxynitride (ZrON) layer on a glass substrate 1 followed by a DLC layer 9. The C-doped ZrON transforms during heat treatment into C-doped zirconium oxide. The DLC based layer 9 has at least two functions; first it replaces a TPF foil and protects the underlying layers during transport and/or processing, and second it serves as a small carbon source to dope the final ZrO-layer.

Figure 5:
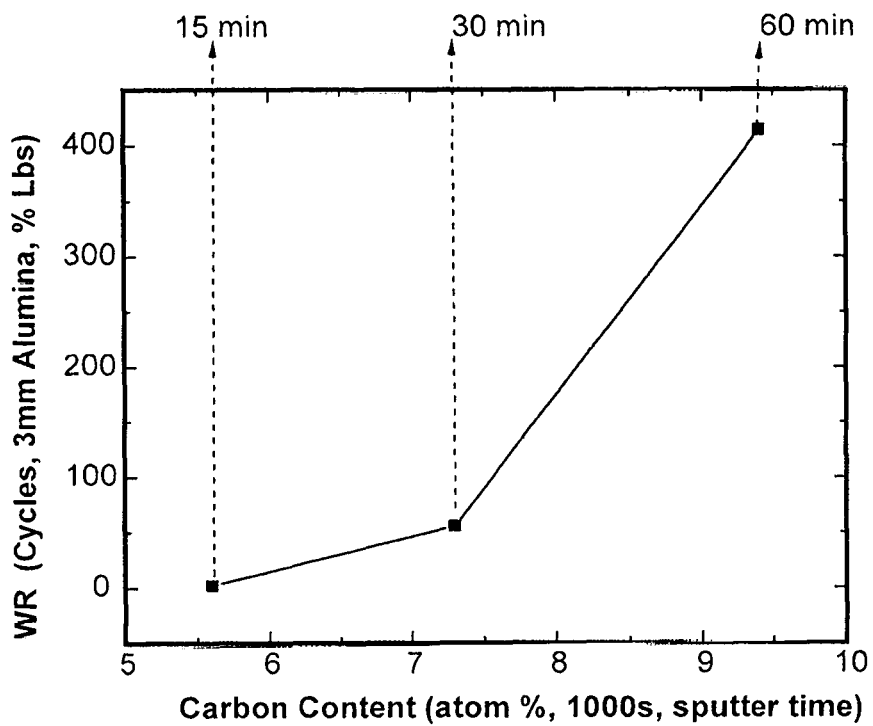
FIG. 5 is a wear resistance vs. carbon content graph, according to an example embodiment of this invention, illustrating that wear resistance improves in a heat treated zirconium oxide based layer as carbon content increases, especially above 8% which could potentially stabilize the cubic phase.

As shown in FIG. 5, it has been surprisingly found higher carbon doping content improves mechanical properties of the resulting layer 11. FIG. 5 shows the wear resistance of a FIG. 1 coating 11 according to an example embodiment of this invention against an alumina sphere, where the coated article is tempered at different times in box furnace at 600° C. The times along the top horizontal axis in FIG. 5 are tempering times in the furnace, the carbon content in terms of atomic % is along the bottom horizontal axis and was measured via XPS analysis for 1000 s sputter time via Ar ions, and wear resistance (WR) using a 3 mm alumina sphere is along the vertical axis in FIG. 5. FIG. 5 illustrates that it was surprisingly found that at longer tempering times, as the carbon content in layer 11 increased the wear resistance also significantly increased. In particular, FIG. 5 shows wear resistance (using a 3 mm alumina sphere at 5 lbs. pressure on the coating 11, with the vertical axis indicating the number of taber/wear cycles the coating was able to withstand) as a function of carbon content.

In order to provide an additional carbon source, $C_2F_6$ gas has been added during sputter deposition of the ZrN layer. FIG. 5 shows the wear resistance measured with a linear Taber tester with 30 Hz, 5 Lbs load equipped with a 3 mm Alumina sphere as a function of position. Large area glass plates (6 m length and 3.21 m width) have been coated. Each number of position corresponds to a distance of 10 cm. Samples of 10×10 cm have been taken at different positions of the glass plate and have been tempered 8 min at 700° C. in a small box furnace. One can increase the wear resistance due to $C_2F_6$ added into the sputter gas atmosphere. One can see in FIG. 5 the impact on $C_2F_6$ inlet on the wear resistance especially in the center of the plate, were we reach between 600 and 1000 cycles compared to less than 100 cycles without $C_2F_6$ inlet for ZrN deposition. Wear resistance under similar conditions for DLC based layers shows 200 cycles before scratching.

Figure 6:
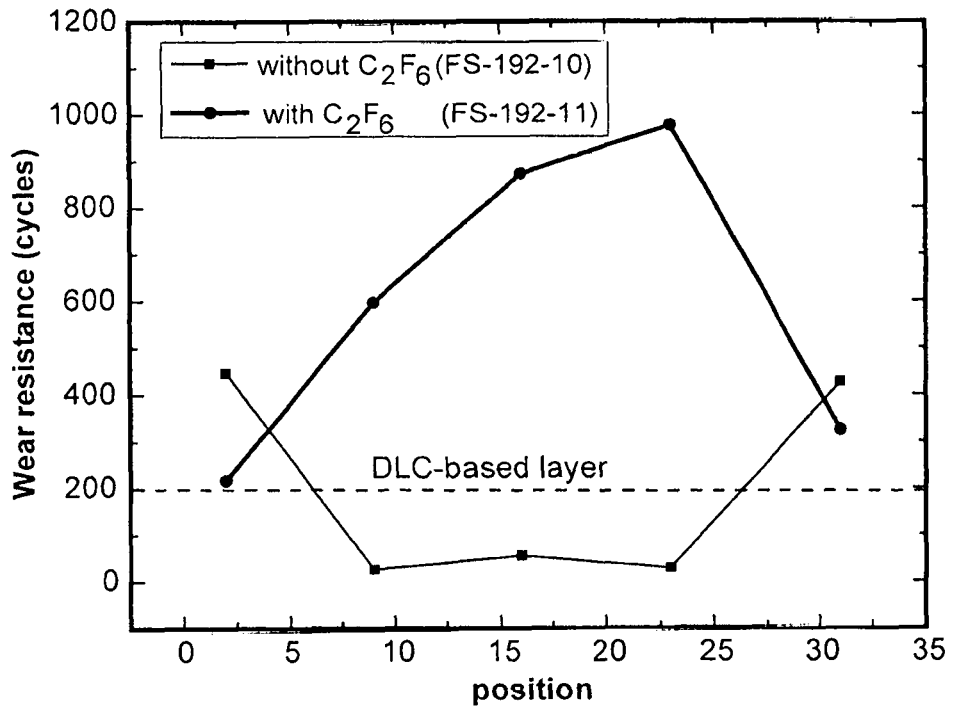
FIG. 6 is a wear resistance versus position on substrate graph comparing a C-doped to both a non-C-doped zirconium based layer following heat treatment, and to a DLC layer, evidencing that the C-doping prior to heat treatment significantly improves wear resistance compared to both especially in a central area of the substrate.

FIG. 6 illustrates the impact of carbon doping (using $C_2F_6$ gas during sputtering of layer 7, 7', 7", 52) during ZrN or ZrON deposition on wear resistance (3 mm alumina sphere, 5 lbs. load by the sphere on the coating) of layer 11 following heat treatment (8 min, 700° C.). Wear resistance for simply a DLC based layer is indicated by the dotted line (again, 5 lbs. pressure by the 3 mm alumina sphere). Other than the straight DLC plot, the two other plots in FIG. 6 plot wear resistance with carbon doping via $C_2F_6$ gas (sample FS-192-11) vs. without carbon doping via $C_2F_6$ gas (sample FS-192-10), at various position on the coated article. The horizontal axis in FIG. 6 indicates different positions on the coated article, moving from left to right. It can be seen in FIG. 6 that the heat treated sample where carbon-doping via $C_2F_6$ gas of layer 7, 7" was performed realized significantly better scratch resistance compared to both a non-HT DLC layer on a substrate and the heat treated sample where carbon-doping via $C_2F_6$ gas of layer 7, 7" was not performed. This is a surprising and unexpected improvement. Additionally, regarding FIG. 6, note that there may have been a small amount of carbon doping in FS-192-10 (where no $C_2F_6$ gas was used) due to cross talk from carbon containing precursor gas used for DLC deposition such as $CH_4$ and/or $C_2H_2$).

The layers 11 from the samples shown in FIG. 6 were analysed for carbon and fluorine content via XPS analysis (see Table 1 below). Note that the F-content was essentially below the detection limit of XPS. After removing the outermost top layer by Ar-ion sputtering/milling for 1,000 seconds prior to depth XPS analysis, the sample deposited with $C_2F_6$ for carbon doping (sample FS-192-11) showed about 30% more carbon (5.8% C vs. 4.3% C) in the heat treated layer 11 compared to the sample (FS-192-10) where no carbon doping via $C_2F_6$ gas occurred. The carbon content in the sample where no carbon doping via $C_2F_6$ gas occurred likely came at least partially from cross talk from carbon inclusive gas used for DLC deposition and/or from the DLC layer 9 during combustion thereof. Note, however, that the carbon amount from the DLC layer 9 in layer 11 is insufficient to significant improve scratch resistance as shown in FIGS. 5-6. The higher carbon content is a key for the improved mechanical properties using $C_2F_6$ during deposition. In embodiments of this invention, using $C_2F_6$ during deposition also has been found to result in significantly more (e.g., about double) C—Zr at the surface of layer 11 and layers 7, 7', 7", 52.

TABLE 1

| Sample | C2F6 | Ar sputtering (s) | F (at %) | C (at %) | Zr (at %) | O (at %) |
|---|---|---|---|---|---|---|
| FS-192-10 | no | 500 | 0.3 | 4.5 | 31.4 | 63.8 |
| FS-192-10 | no | 1000 | 0.2 | 4.3 | 31.8 | 63.7 |
| FS-192-11 | yes | 500 | 0.1 | 4.9 | 32 | 63 |
| FS-192-11 | yes | 1000 | 0.2 | 5.8 | 31.8 | 62.2 |

Peak fitting of the individual signals allows the detection of the individual bonding of the carbon dopant due to chemical shift of the photo electrons emitted by the sample (see Table 2 below). One can see that for both samples about 50% of the carbon is interstitial and not bonded to oxygen or zirconium. The sample deposited without $C_2F_6$ show no carbide component at the nearer surface, but the sample deposited with $C_2F_6$ did. In addition, we found about the double amount of C—Zr bonding after 1000 s sputtering time. The higher wear resistance is believed to be due to the higher amount of carbon bonded to zirconium, which is much higher in the sample using $C_2F_6$ gas for C doping during deposition.

TABLE 2

| Sample | C2F6 | Ar sputtering (s) | C—H/C—C (%) | C—O/C=O/O—C=O (%) | C—Zr (%) |
|---|---|---|---|---|---|
| FS-192-10 | no | 500 | 72.2 | 27.8 | 0 |
| FS-192-10 | no | 1000 | 52.1 | 29.6 | 18.4 |

TABLE 2-continued

| Sample | C2F6 | Ar sputtering (s) | C—H/C—C (%) | C—O/C=O/O—C=O (%) | C—Zr (%) |
|---|---|---|---|---|---|
| FS-192-11 | yes | 500 | 57.6 | 14.7 | 27.7 |
| FS-192-11 | yes | 1000 | 47.2 | 13.9 | 38.6 |

Table 3 shows the Critical Scratch Load (CSL) of FS-192-11 with $C_2F_6$ used during deposition of a zirconium nitride based layer and then tempered to form layer 11. There is significant improvement compared to a DLC coating. Especially against alumina sphere we have found about the double scratch load compared to a DLC coating on a substrate over silicon nitride which scratches at a load of about 8 kg.

TABLE 3

| | 3 mm sphere | | | |
|---|---|---|---|---|
| | #1 | #2 | #3 | AVERAGE |
| Alumina (kg) | 16.2 | 21.1 | 15.1 | 17.5 |
| Stainless steel (kg) | 24.3 | 17.7 | 20.1 | 20.7 |

Figure 7:
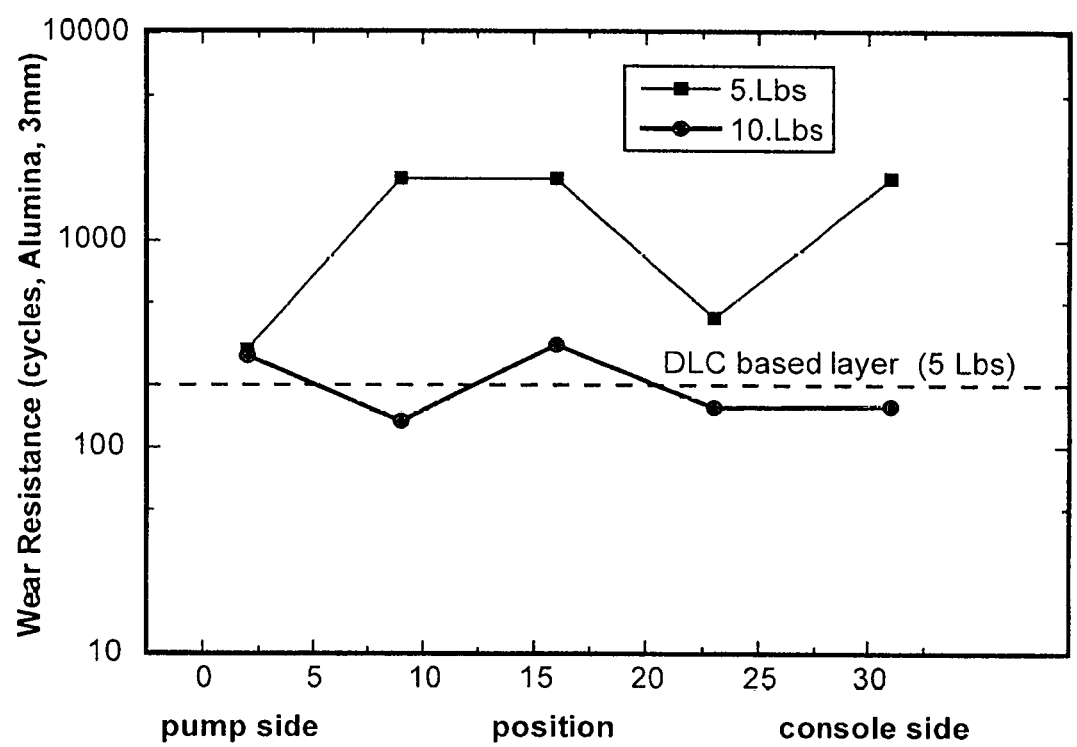
FIG. 7 is a wear resistance versus position on substrate with linear taber abraser graph showing wear resistance of a coated article according to the FIG. 4 embodiment of this invention (with five and ten pound taber abrasers) compared to a DLC layer on a substrate with a five pound taber abraser.

An example was made according to the FIG. 4 embodiment. On a 8 mm clear float glass substrate, as shown in FIG. 4 a 59 nm thick C-doped layer 52 of or including zirconium nitride was sputter-deposited from at least one Zr target in the presence of argon (150 sccm), nitrogen (102 sccm), and $C_2F_6$ (16 sccm) gases, then a 15 nm thick layer 53 of or including zirconium oxynitride was sputter-deposited on the substrate from at least one Zr target in the presence of argon (150 sccm), nitrogen (115 sccm) and oxygen (15 sccm) gases, and then a 10 nm thick DLC layer 9 was ion beam deposited on the substrate 1 in the presence of argon and acetylene gases over the other layers. Following thermal tempering, the result was a 84 nm thick layer 11 of or including C-doped zirconium oxide on the glass substrate. FIG. 7 plots the wear resistance for this example above according to the FIG. 4 embodiment, vs. a simple DLC layer on a substrate. The dotted line horizontal plot in FIG. 7 is the wear resistance of a DLC layer on an 8 mm clear glass substrate with 5 lbs of pressure applied thereto via a 3 mm alumina sphere. The other two plots in FIG. 7 are for different loads (5 lbs. corresponding to a Hertzian Pressure of 1.9 GPa, and 10 lbs. corresponding to a Hertzian Pressure of 2.4 GPa) applied via a 3 mm alumina sphere to a sample according to the FIG. 4 embodiment of this invention deposited with $C_2F_6$ gas for carbon doping in a zirconium nitride based layer 52 on an 8 mm clear glass substrate that was then heat treated (8 minutes, 700 degrees C.) to form carbon doped layer 11. This C-doped sample in FIG. 7 according to an example FIG. 4 embodiment of this invention reached the maximum number of 2000 cycles preselected on the linear taber abraser using a load of 5 lbs. with the alumina sphere. Even with the double load of 10 lbs., more than 100 cycles have been achieved on the full jumbo width. For purpose of comparison, with the same 5 lbs of pressures for scratching applied, the sample according to this invention achieved over 1,000 cycles without scratching whereas the DLC layer scratched at only a little over 100 cycles.

Cased on colour and appearance the new coating also show improved aesthetics, mainly due to higher transmission and negative b* in transmission (compared to DLC on a glass substrate over silicon nitride) in certain example embodiments. For example, the example according to the example of this invention made above had a visible transmission of 75%, and a DLC layer on a substrate had a visible transmission of 69%.

Accordingly, in certain example embodiments of this invention, doping zirconia with carbon improves mechanical properties on zirconia coated glass. Carbon may be provided by a sacrificial DLC layer on top of ZrN and/or ZrON layers, and/or (b) incorporation of a carbon inclusive gas such as $C_2F_6$ into the sputtering gases during deposition of the Zr inclusive layer. A higher amount of C—Zr on the surface is likely responsible for at least part of the increase in wear resistance (e.g., scratch resistance) against alumina. For instance, critical scratch load of layer 11 against alumina in certain example embodiments of this invention may be about 17.5 kg (3 mm alumina sphere) and thus about 2 times higher compared to about 8 kg measured on DLC.

In certain embodiments of this invention, there is provided a method of making a heat treated coated article, the method comprising: having a coated article including a coating supported by a glass substrate, the coating comprising a carbon-doped layer comprising an oxide and/or nitride of zirconium, and wherein the carbon-doped layer comprising an oxide and/or nitride of zirconium is substantially free of tungsten, copper, and zinc; and thermally tempering the coated article, including the glass substrate and the carbon-doped layer comprising an oxide and/or nitride of zirconium, so that after the tempering a layer comprising carbon-doped zirconium oxide is provided on the glass substrate, wherein the layer comprising carbon-doped zirconium oxide comprises from 4.7 to 20 atomic % carbon.

In the method of the immediately preceding paragraph, there may be more zirconium than carbon in each of (i) the carbon-doped layer comprising an oxide and/or nitride of zirconium, and (ii) the layer comprising carbon-doped zirconium oxide.

In the method of any of the preceding two paragraphs, a metal content of the layer comprising carbon-doped zirconium oxide may be from 80-100% Zr (atomic %), more preferably from 90-100% Zr (atomic %), and most preferably from 99-100% Zr (atomic %).

In the method of any of the preceding three paragraphs, the layer comprising carbon-doped zirconium oxide may comprise from 4.8-15 atomic % carbon, more preferably from 5.0-12.0 atomic % carbon, more preferably from 7.0-12% atomic % carbon, and sometimes from 8.0-12.0 atomic % carbon.

In the method of any of the preceding four paragraphs, the layer comprising carbon-doped zirconium oxide may include C-doped $Zr_xO_y$, where y/x is from about 1.2 to 2.5, possibly where y/x is from about 1.4 to 2.1.

In the method of any of the preceding five paragraphs, the layer comprising carbon-doped zirconium oxide may further comprises fluorine.

In the method of any of the preceding six paragraphs, prior to said tempering the carbon-doped layer comprising an oxide and/or nitride of zirconium may be of or include carbon-doped zirconium nitride.

In the method of any of the preceding seven paragraphs, prior to said tempering the carbon-doped layer comprising an oxide and/or nitride of zirconium may comprise carbon-doped zirconium oxynitride.

In the method of any of the preceding eight paragraphs, prior to the tempering, the coating may further comprise a layer comprising diamond-like carbon located on the glass substrate over at least the carbon-doped layer comprising an oxide and/or nitride of zirconium.

In the method of any of the preceding nine paragraphs, prior to and after the tempering, the coating may further comprises a dielectric layer (e.g., silicon nitride and/or silicon oxynitride) between the glass substrate and the carbon-doped layer comprising an oxide and/or nitride of zirconium.

In the method of any of the preceding ten paragraphs, the layer comprising carbon-doped zirconium oxide may comprises a nanocrystalline cubic lattice structure and/or a tetragonal lattice structure.

In the method of any of the preceding eleven paragraphs, the layer comprising carbon-doped zirconium oxide may be an outermost layer of the coating following tempering.

In the method of any of the preceding twelve paragraphs, the tempered coated article may have a visible transmission of at least 50%.

In the method of any of the preceding thirteen paragraphs, the carbon-doped layer comprising an oxide and/or nitride of zirconium may be free of tungsten, copper, and zinc.

In the method of any of the preceding fourteen paragraphs, the layer comprising carbon-doped zirconium oxide may be free of tungsten, copper, and zinc.

In the method of any of the preceding fifteen paragraphs, the layer comprising carbon-doped zirconium oxide need not contain any metal other than Zr. In the method of any of the preceding sixteen paragraphs, the method may further comprise sputter-depositing the carbon-doped layer comprising an oxide and/or nitride of zirconium in the presence of at least carbon inclusive gas. The carbon inclusive gas may comprise $C_2F_6$. At least 5 sccm of the carbon inclusive gas may be used during the sputter-deposition of the carbon-doped layer comprising an oxide and/or nitride of zirconium.

In certain example embodiments of this invention, there is provided a method of making a heat treated coated article, the method comprising: having a coated article including a coating supported by a glass substrate, the coating comprising a carbon-doped layer comprising an oxide and/or nitride of zirconium; and thermally tempering the coated article, including the glass substrate and the carbon-doped layer comprising an oxide and/or nitride of zirconium, so that after the tempering a layer comprising carbon-doped zirconium oxide is provided on the glass substrate, wherein the layer comprising carbon-doped zirconium oxide comprises from 4.7 to 20 atomic % carbon and is substantially free of tungsten, copper, and zinc. The method may further include sputter-depositing the carbon-doped layer comprising an oxide and/or nitride of zirconium in the presence of at least carbon inclusive gas such as $C_2F_6$.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A method of making a heat treated coated article, the method comprising:
    having a coated article including a coating supported by a glass substrate, the coating comprising a carbon-doped layer comprising an oxide and/or nitride of zirconium, and wherein the carbon-doped layer comprising an oxide and/or nitride of zirconium is substantially free of tungsten, copper, and zinc; and
    heat treating the coated article for at least thirty minutes at temperatures of from 580-800 degrees C., including the glass substrate and the carbon-doped layer comprising an oxide and/or nitride of zirconium, so that after the heat treating a layer comprising carbon-doped zirconium oxide is provided on the glass substrate, wherein the layer comprising carbon-doped zirconium oxide comprises from 4.7 to 20 atomic % carbon.

2. The method of claim 1, wherein there is more zirconium than carbon in each of (i) the carbon-doped layer comprising an oxide and/or nitride of zirconium, and (ii) the layer comprising carbon-doped zirconium oxide.

3. The method of claim 1, wherein a metal content of the layer comprising carbon-doped zirconium oxide is from 80-100% Zr (atomic %).

4. The method of claim 1, wherein a metal content of the layer comprising carbon-doped zirconium oxide is from 90-100% Zr (atomic %).

5. The method of claim 1, wherein a metal content of the layer comprising carbon-doped zirconium oxide is from 99-100% Zr (atomic %).

6. The method of claim 1, wherein the layer comprising carbon-doped zirconium oxide comprises from 4.8-15 atomic % carbon.

7. The method of claim 1, wherein the layer comprising carbon-doped zirconium oxide comprises from 5.0-12.0 atomic % carbon.

8. The method of claim 1, wherein the layer comprising carbon-doped zirconium oxide comprises from 7.0-12.0 atomic % carbon.

9. The method of claim 1, wherein the layer comprising carbon-doped zirconium oxide includes C-doped $Zr_x O_y$, where y/x is from about 1.2 to 2.5.

10. The method of claim 1, wherein the layer comprising carbon-doped zirconium oxide further comprises fluorine.

11. The method of claim 1, wherein prior to said heat treating the carbon-doped layer comprising an oxide and/or nitride of zirconium comprises carbon-doped zirconium nitride.

12. The method of claim 1, wherein prior to said heat treating the carbon-doped layer comprising an oxide and/or nitride of zirconium comprises carbon-doped zirconium oxynitride.

13. The method of claim 1, wherein prior to the heat treating, the coating further comprises a layer comprising diamond-like carbon located on the glass substrate over at least the carbon-doped layer comprising an oxide and/or nitride of zirconium.

14. The method of claim 1, wherein prior to and after the heat treating, the coating further comprises a dielectric layer between the glass substrate and the carbon-doped layer comprising an oxide and/or nitride of zirconium.

15. The method of claim 1, wherein the layer comprising carbon-doped zirconium oxide comprises a nanocrystalline cubic lattice structure and/or a tetragonal lattice structure.

16. The method of claim 1, wherein the layer comprising carbon-doped zirconium oxide is an outermost layer of the coating following tempering.

17. The method of claim 1, wherein the heat treated coated article has a visible transmission of at least 50%.

18. The method of claim 1, wherein the carbon-doped layer comprising an oxide and/or nitride of zirconium is free of tungsten, copper, and zinc.

19. The method of claim 1, wherein the layer comprising carbon-doped zirconium oxide is free of tungsten, copper, and zinc.

20. The method of claim 1, wherein the layer comprising carbon-doped zirconium oxide does not contain any metal other than Zr.

21. The method of claim 1, further comprising sputter-depositing the carbon-doped layer comprising an oxide and/or nitride of zirconium in the presence of at least carbon inclusive gas.

22. The method of claim 21, wherein the carbon inclusive gas comprises $C_2F_6$.

23. The method of claim 21, wherein at least 5 sccm of the carbon inclusive gas is used during the sputter-deposition of the carbon-doped layer comprising an oxide and/or nitride of zirconium.

24. A method of making a heat treated coated article, the method comprising:
having a coated article including a coating supported by a glass substrate, the coating comprising a carbon-doped layer comprising an oxide and/or nitride of zirconium; and
heat treating the coated article for at least thirty minutes minutes at temperatures of 580-800 degrees C., including the glass substrate and the carbon-doped layer comprising an oxide and/or nitride of zirconium, so that after the heat treating a layer comprising carbon-doped zirconium oxide is provided on the glass substrate, wherein the layer comprising carbon-doped zirconium oxide comprises from 4.7 to 20 atomic % carbon and is substantially free of tungsten, copper, and zinc.

25. The method of claim 24, further comprising sputter-depositing the carbon-doped layer comprising an oxide and/or nitride of zirconium in the presence of at least carbon inclusive gas.

26. The method of claim 24, wherein the carbon inclusive gas comprises $C_2F_6$.

27. The method of claim 24, wherein the layer comprising carbon-doped zirconium oxide comprises from 7.0-12.0 atomic % carbon.

28. A method of making a heat treated coated article, the method comprising:
sputter-depositing a carbon-doped layer comprising an oxide and/or nitride of zirconium on a glass substrate;
wherein said sputter-depositing of the carbon-doped layer comprising an oxide and/or nitride of zirconium includes sputtering a target comprising zirconium in the presence of at least a carbon inclusive gas;
heat treating the coated article for at least thirty minutes at temperatures of 580-800 degrees C., including the glass substrate and the carbon-doped layer comprising an oxide and/or nitride of zirconium, so that after the heat treating a layer comprising carbon-doped zirconium oxide is provided on the glass substrate, wherein the layer comprising carbon-doped zirconium oxide is substantially free of tungsten, copper, and zinc.

29. The method of claim 28, wherein the carbon inclusive gas comprises $C_2F_6$.

30. The method of claim 28, wherein the layer comprising carbon-doped zirconium oxide does not contain any metal other than Zr.

\* \* \* \* \*